United States Patent [19]
Fowler et al.

[11] Patent Number: 5,710,691
[45] Date of Patent: Jan. 20, 1998

[54] PROGRAMMABLE CONTROL UNIT

[76] Inventors: David C. Fowler, 210 Oak St., Surgoinsville, Tenn. 37873; Dale D. Cummings, 5618 Hwy. 52, Dawsonville, Ga. 30534

[21] Appl. No.: 638,118

[22] Filed: Apr. 26, 1996

[51] Int. Cl.⁶ .................... H02H 3/00; G01R 19/00
[52] U.S. Cl. .................. 361/94; 361/78; 361/87; 361/83; 364/480; 364/483
[58] Field of Search ............... 361/79, 83, 87, 361/93, 94, 98, 99, 96, 101, 102, 42, 49, 78; 364/480, 483; 307/141

[56] References Cited

U.S. PATENT DOCUMENTS

| | | | |
|---|---|---|---|
| 4,130,748 | 12/1978 | Schwer | 200/38 D |
| 4,223,307 | 9/1980 | Albritton | 340/656 |
| 4,249,035 | 2/1981 | Watley | 174/52 |
| 4,260,213 | 4/1981 | Kotski et al. | 439/185 |
| 4,422,018 | 12/1983 | Bailey | 315/360 |
| 4,471,232 | 9/1984 | Peddie et al. | 307/35 |
| 4,712,019 | 12/1987 | Nilssen | 307/141 |
| 4,829,457 | 5/1989 | Russo et al. | 364/550 |
| 4,903,162 | 2/1990 | Kopelman | 361/103 |
| 5,029,269 | 7/1991 | Elliott et al. | 363/21 |
| 5,122,726 | 6/1992 | Elliott et al. | 323/272 |
| 5,161,240 | 11/1992 | Johnson | 361/42 |
| 5,220,478 | 6/1993 | Innes et al. | 361/93 |
| 5,224,010 | 6/1993 | Tran et al. | 361/90 |

*Primary Examiner*—Jeffrey A. Gaffin
*Assistant Examiner*—Michael J. Sherry
*Attorney, Agent, or Firm*—Chase & Yakimo

[57] ABSTRACT

A programmable control unit for protecting an appliance connected to a household power source comprises a modular unit plugged into a household power socket. The modular unit presents a socket for plugging a household appliance therein. An internal microprocessor has program logic for analyzing the period of current flow to the household appliance and/or the power consumed thereby. Once the time period of operation and/or rate of energy consumption exceeds preselected values, the program logic of the microprocessor opens a relay so as to cease current flow to the appliance. The maximum threshold values of time and/or energy can be varied by the user according to the utilized appliance. The use of the intermediate unit enables a plurality of appliances to be safely coupled to the household power.

18 Claims, 3 Drawing Sheets

Replacement outlet

Modular Unit

PROGRAMMABLE CONTROL UNIT

BACKGROUND OF THE INVENTION

This invention relates to a protector for a household appliance or the like and, more particularly, to a modular control unit which ceases power delivery to the protected appliance after threshold values of operational time and/or consumed electrical energy are sensed.

It is desirable to control the delivery of current to household appliances or the like, particularly when an appliance has been left on for an extended period of time or abnormal conditions of power consumption occur due to power surges, lightning, faulty operation, etc. The ability to adjust and monitor threshold values of time and power is also desirable as the time of appliance use and/or the amount of consumed electrical energy are important factors in the safe use of appliances.

Certain household appliances, such as coffee makers, irons, etc. have internal switching mechanisms which will cease current flow through the appliance after a certain preset period of time. However, such an internal mechanism is a simple internal switch for that device only. Thus, it is desirable to present a unit which protects various separate household appliances with the time period of operation also being variously adjustable.

In response thereto we have invented a power delivery control in the form of a programmable, modular unit which is plugged into a household wall socket. The modular unit includes a microprocessor chip having internal program logic for analyzing the time period of current delivery to an appliance plugged into the unit and/or the amount of electrical energy being consumed by the appliance. Threshold values, indicative of current time or energy consumed, may be varied from preselected values. Upon reaching a predetermined threshold level, the modular unit ceases the delivery of power to the appliance.

It is therefore a general object of this invention to provide a modular unit for controlling the delivery of power to an appliance plugged therein.

Another object of this invention is to provide a unit, as aforesaid, which measures time and/or energy consumption values associated with current delivered to an associated appliance.

It is another object of this invention to provide a unit, as aforesaid, having a current relay intermediate a household power source and the appliance, the relay states being controlled by the modular control unit.

A still further object of this invention to provide a unit, as aforesaid, which regulates the maximum time of current delivery and/or power consumed by the appliance.

Other objects and advantages of this invention will become apparent from the following description taken in connection with the accompanying drawings, wherein is set forth by way of illustration and example, an embodiment of this invention.

DESCRIPTION OF THE PREFERRED EMBODIMENT

Figure 1:
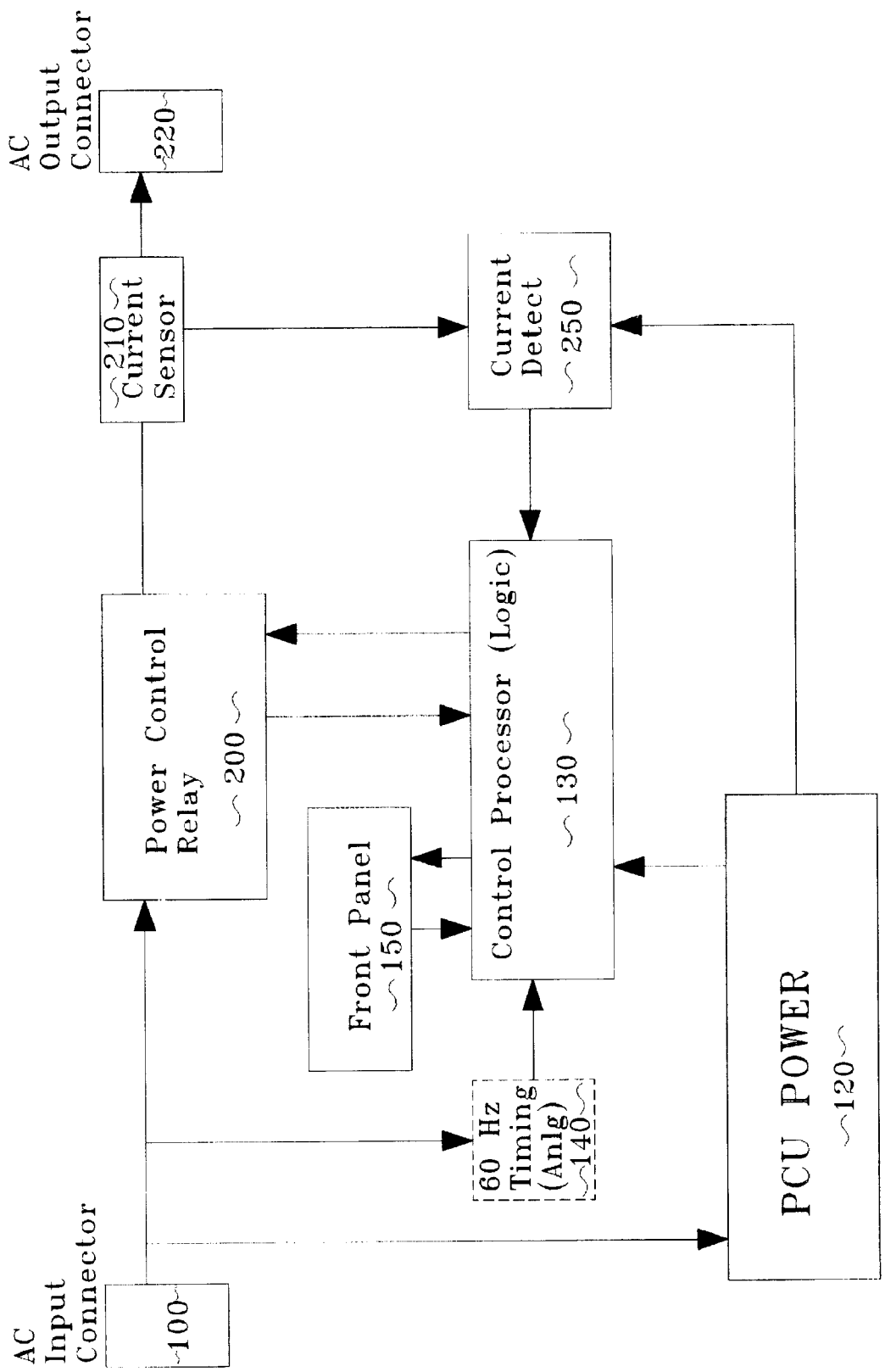
FIG. 1 is a general block diagram of the unit components.
Figure 2:
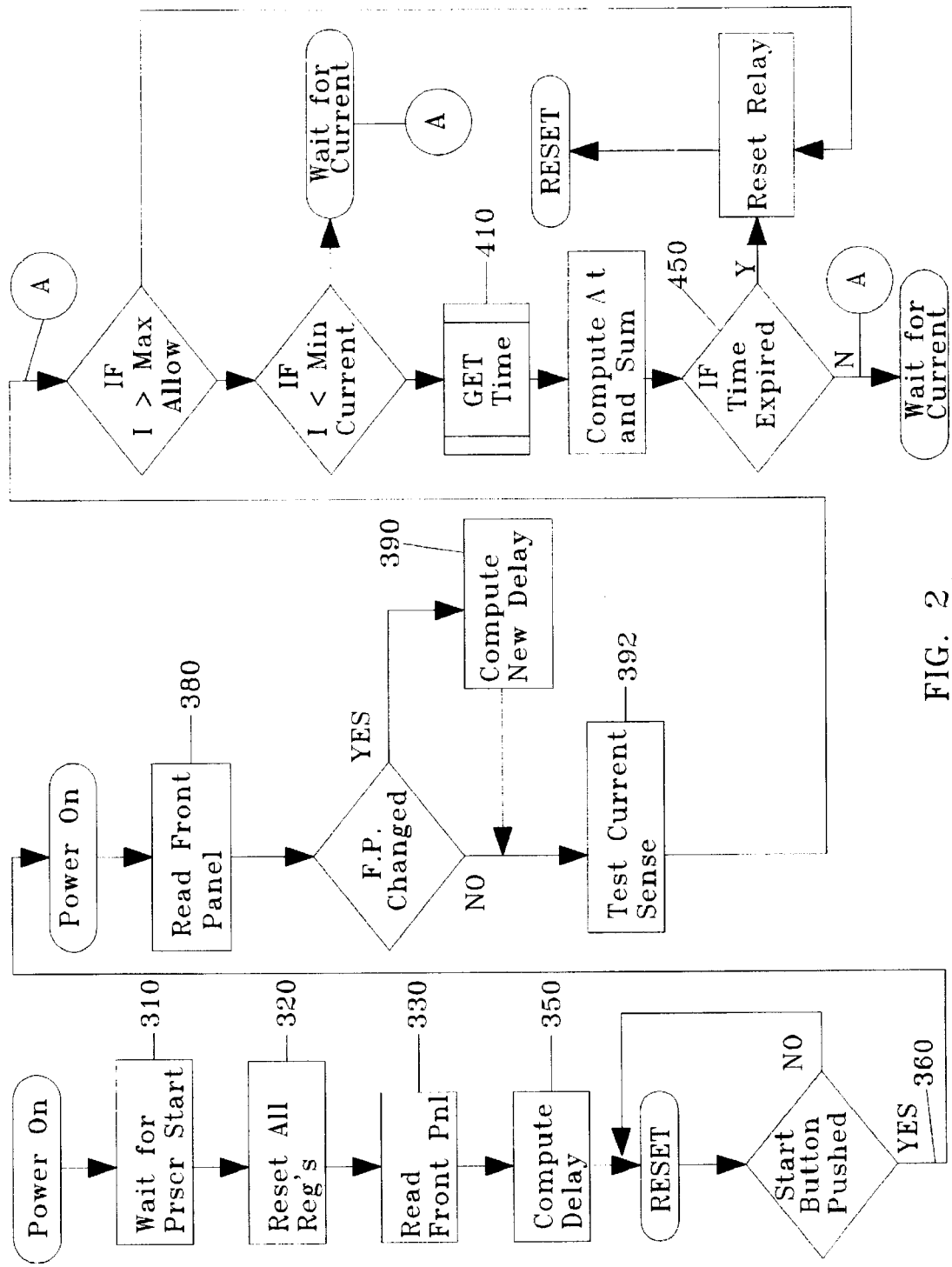
FIG. 2 is a diagram showing the program logic associated with the control processor of the unit.
Figure 3:
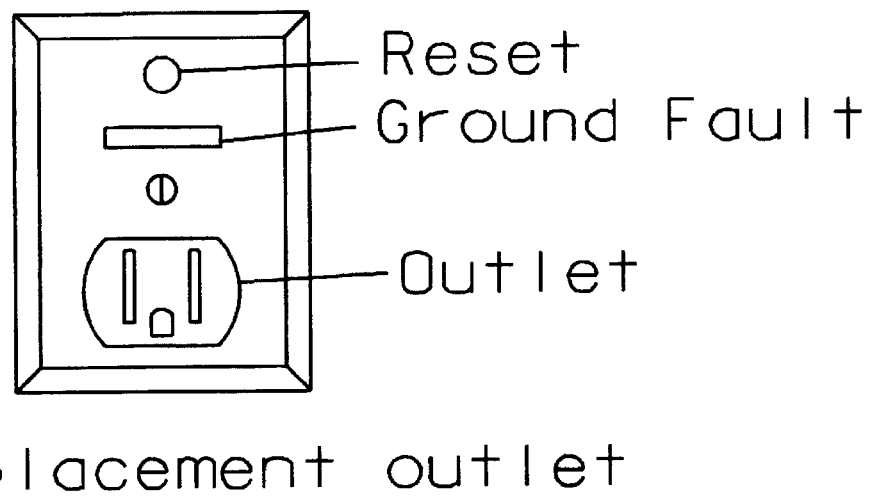
FIG. 3 illustrates a wall outlet for the household power.
Figure 4:
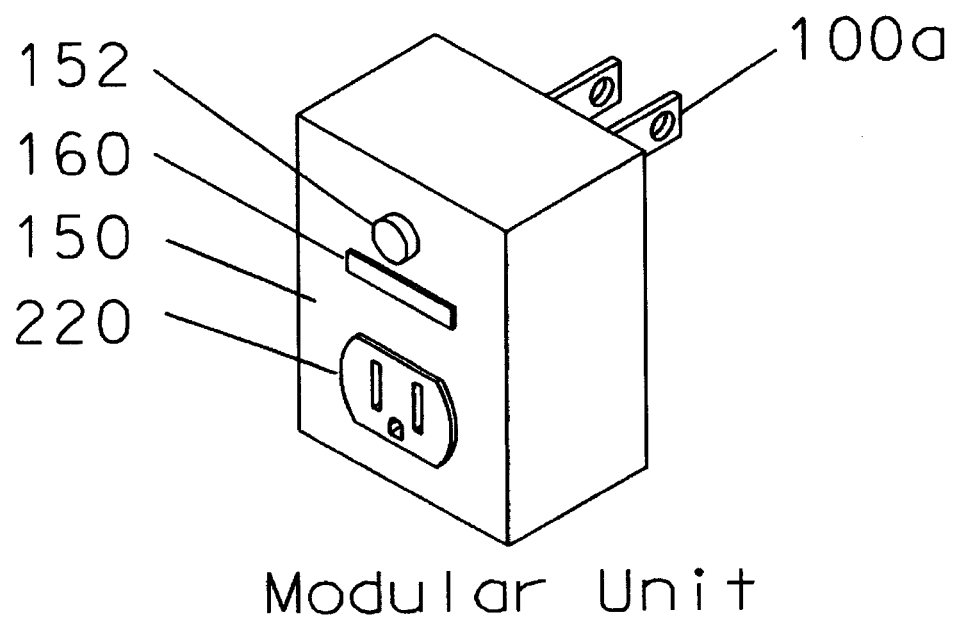
FIG. 4 is a perspective view generally showing one form of the housing of the modular unit.
Figure 1:
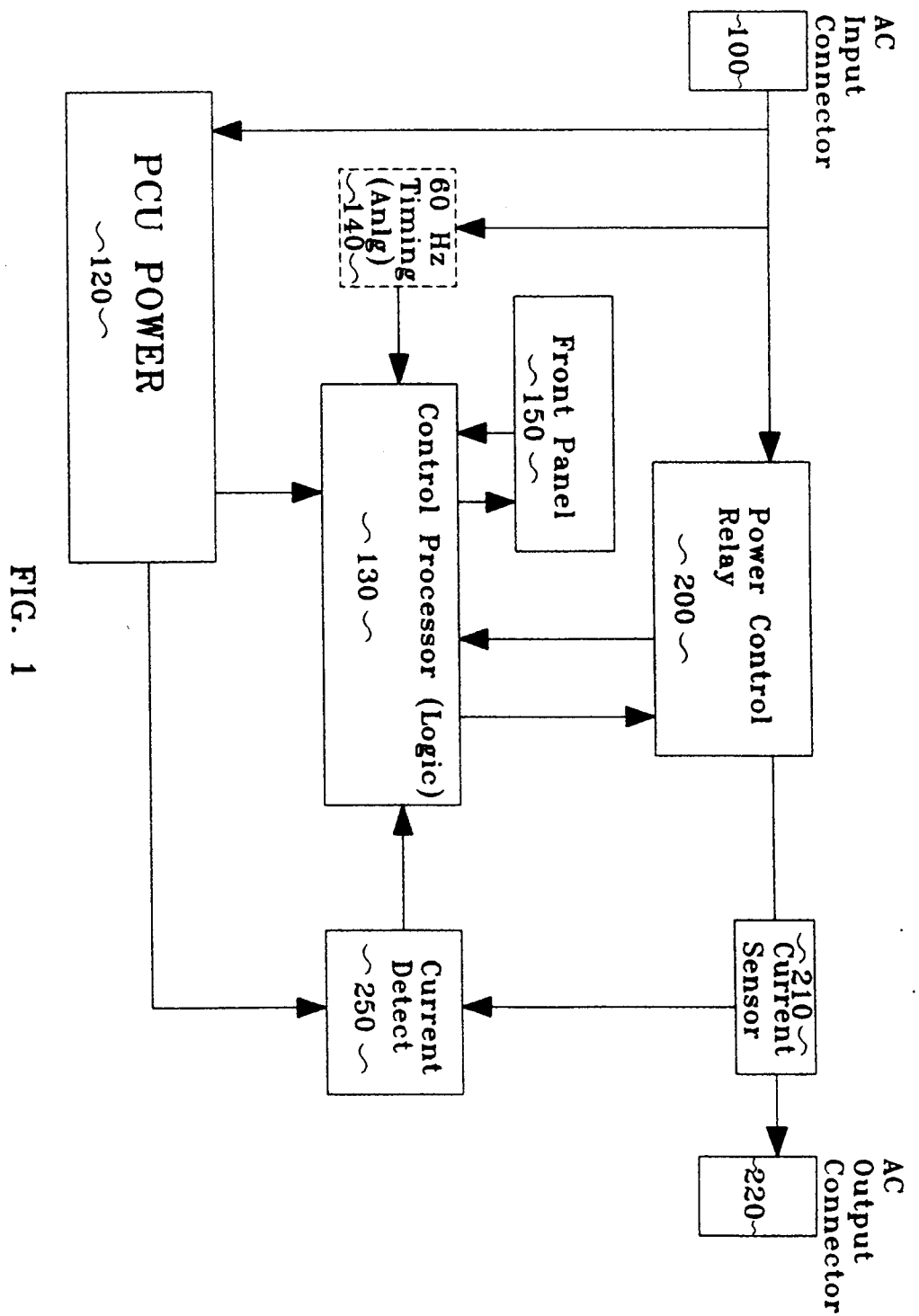
Figure 2:
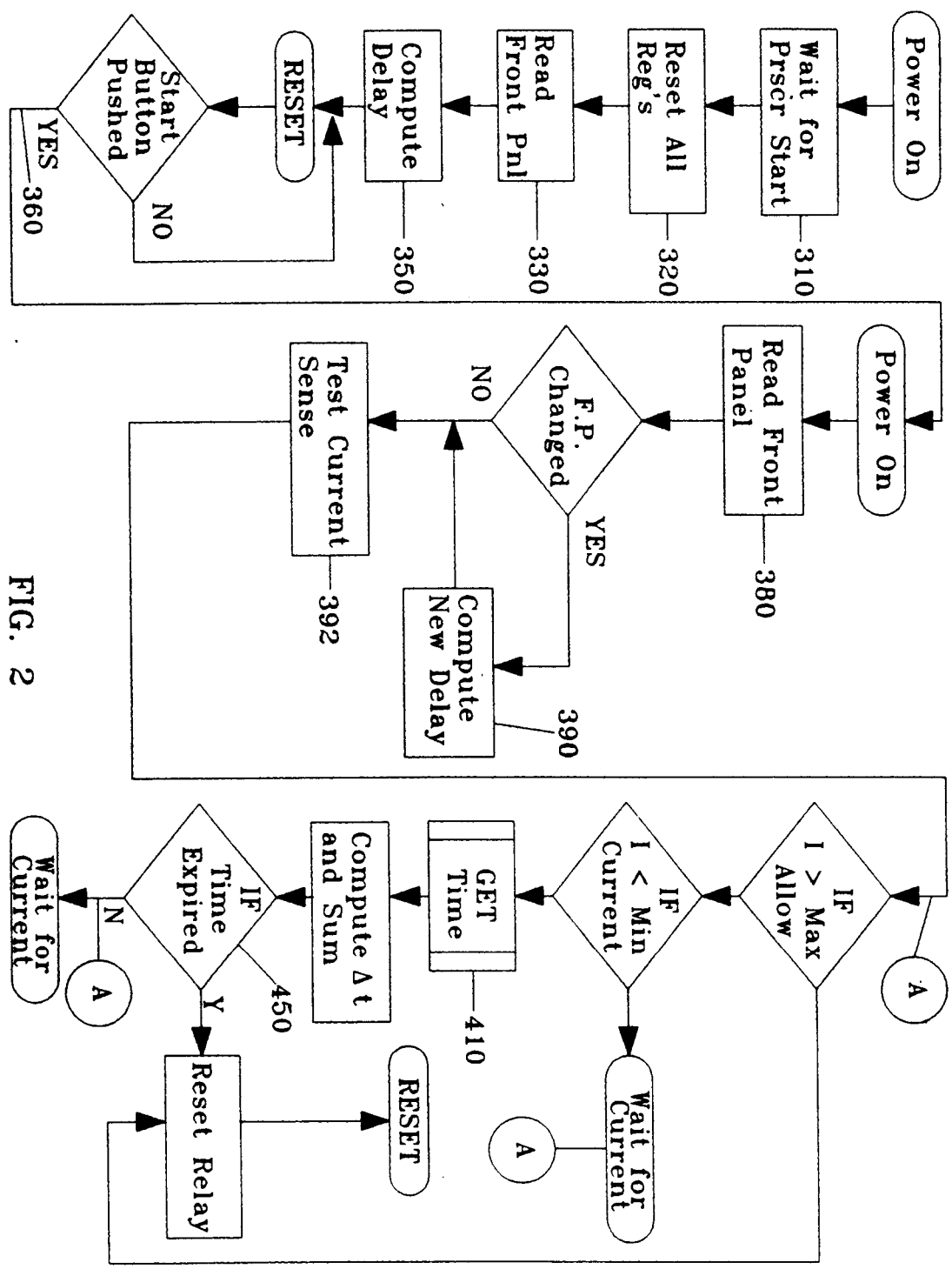
Figure 3:
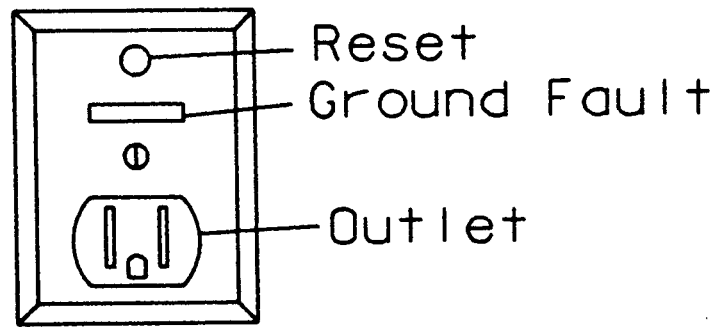
Figure 4:
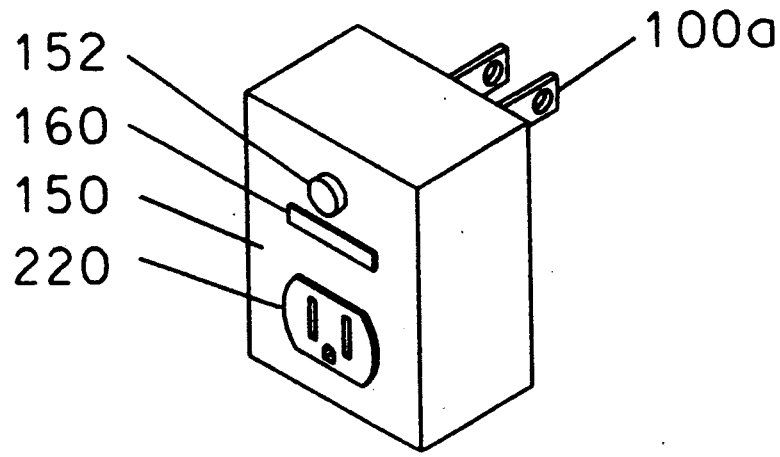

FIG. 1 generally shows a block diagram of the components of our control unit 10, including an AC input connector 100 generally in the form of a plug 100a for connection to wall socket 100b as shown in FIG. 3. The modular control unit 10, as shown in FIG. 4, generally includes a PCU power chip 120, a central processor 130 having the FIG. 2 program logic therein, a 60 Hz timing element 140, control relay 200 and a socket 220 for plugging the appliance therein. A current sensor 210 is in series with relay 200 which allows current to be drained to a current detect 250. This current drain through a current detect 250 enables data to be passed to processor 130 indicative of the current.

On the front panel 150 of unit 10 is a reset button 160 which sets the arithmetic registers associated with the processor program logic to an initial state including the initial preselected values of threshold parameters to be utilized by the FIG. 2 program logic. FIG. 2 further provides a dial 152 which provides an user-operable analog interface between the user and the processor 130. For example, the dial 152 may have a number of detent positions which will vary the maximum preselected threshold value of time of use of the appliance, such value being a signal provided to the FIG. 2 program logic.

Upon connection of the unit 10 to the wall socket via plug 100a and plugging an appliance into socket 220, a current flows through the closed relay 200. The current detect 250 combines with sensor 210 so as to provide usable information to the processor 130 indicative of the current flow to the appliance along with a current flow to the PCU power chip 120 associated with the central processor 130 and current detect 250. Concurrently, time pulse information is delivered to the program logic of the central processor 130 as current passes through the 60 Hz timing chip 140.

The time and current information being received by the control processor 130 is processed by the program logic shown in FIG. 2. Upon initial plug in of the unit 10 into the wall socket, the processor start up at 210 resets all internal registers to zero at 320. The threshold value of at least time is read from the front panel at 330, it being understood that other values may also be delivered such as total energy to be consumed by the appliance. As household power is being used a 120 voltage value is utilized by the program logic. The delay variable 350, i.e. the time period of power delivery, is then computed for use by the FIG. 2 program logic. Upon the appliance start button being pushed at 360 the front panel information at 380 is again read. If the front panel information has changed from that of 330, a new time period of operation is computed at 390.

Current information from sensor 210 is then tested at 392, such information being routed to the processor 130 through current detect 250. If the current value is greater than a maximum allowable value internal to the program logic, the processor 130 opens relay 200 which ceases the current flow to the connected appliance. If less than the internal minimum value, the program will wait for current to be received before repeating this query. Once a proper current is sensed, the time information being received from chip 140 is utilized. At this juncture 410 the time of operation is calculated by the program logic. If the time of operation at 450 is greater than the threshold value of the time parameter, the processor 130 sends a signal which closes relay 200 and ceases current flow. If not, this process is repeated. Upon cessation of current flow to the appliance, the relay will need to be reset for subsequent operation.

It is understood that the calculations performed by the program logic may vary. For example, the calculations may also include a calculation of energy consumed, i.e. power over a time period. If the total energy exceeds an internal threshold parameter of energy, the relay 200 may also be opened ceasing current flow of the appliance. This threshold parameter of energy may also be varied at the front panel. For example, an iron will consume more energy than a coffee maker. Thus, the user may wish to vary the maximum time period or, alternatively, the amount of energy consumed. Thus, it is understood that our device enables one to measure various parameters resulting from the use of household power by an associated appliance.

Accordingly, the program logic in processor 130 can be modified to calculate various values associated with the operation of the appliance so as to cease delivery of current to the appliance upon exceeding such values, e.g. operation/time, maximum current delivered to the appliance and energy consumed thereby. Thus our unit can protect the associated appliance in a number of ways.

It is to be understood that while certain forms of this invention have been illustrated and described, it is not limited thereto except insofar as such limitations are included in the following claims and allowable functional equivalents thereof.

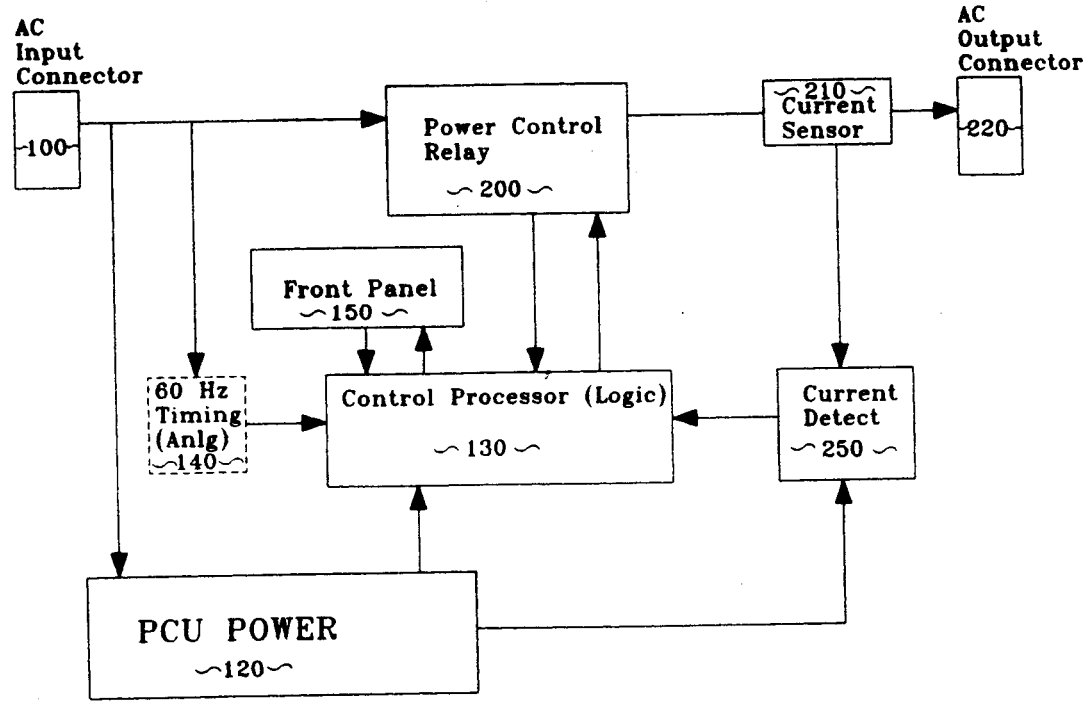

Having thus described the invention, what is claimed as new and desired to be secured by Letters Patent is as follows:

1. A device for protecting an appliance receiving power from a household power socket comprising:
   a modular housing positioned intermediate the household socket and appliance for electrically coupling the appliance to the household power;
   a plug on said housing for connection to the household socket;
   a socket on said housing to electrically couple the appliance to the household power;
   circuit means within said housing and intermediate said housing plug and housing socket for analyzing the power delivered to the appliance, said circuit means comprising:
      a microprocessor having a program logic therein for analyzing data delivered thereto, said data corresponding to a current produced by the household power and delivered to the appliance;
      means for providing a first data stream to said microprocessor indicative of an elapsed time of current delivery to the appliance;
      means for providing to the processor a second data stream indicative of a value of a current flow to the appliance, said program logic utilizing said first and second data streams for calculating at least a time period of operation of the appliance, said logic comparing said time period to a preselected time period of operation;
      relay means having a normally closed position for controlling the current flow from the household socket to the appliance, said processor opening said relay means upon said calculated time of operation exceeding said preselected time period of operation.

2. The device as claimed in claim 1 further comprising means on said modular housing for varying said preselected time period of operation, said means comprising a dial on said housing movable to certain preselected values, said dial values sending data usable by said program logic corresponding to said preselected time period of operation.

3. The device as claimed in claim 1 further comprising means for diverting a portion of the current flow to a current detect device, said current device converting the current to a form usable by said program logic.

4. The device as claimed in claim 1 wherein said program logic calculates the rate of consumption of the power by the appliance, said program logic comparing the calculated consumed power to a preselected value of consumed power, said processor opening said relay means upon said calculated consumption of power exceeding said preselected value of consumed power.

5. The device as claimed in claim 1 wherein said first stream data providing means is a 60 Hz analog time chip, said chip providing data corresponding to seconds of time to said program logic.

6. The device as claimed in claim 1 wherein said program logic includes registers for receiving the data streams therein and further comprising:
   means for setting said registers to a zero value prior to a start up of the appliance.

7. The device as claimed in claim 6 wherein said setting means comprises a switch on said housing, said switch delivering a signal to said program logic for said setting of registers to zero.

8. A device for protecting an appliance receiving power from a household power socket comprising:
   a modular housing positioned intermediate the household socket and appliance for electrically coupling the appliance to the household power;
   a plug on said housing for connection to the household socket;
   a socket on said housing to electrically couple the appliance to the household power;
   circuit means within said housing and intermediate said housing plug and housing socket for analyzing the time period in which power is delivered to the appliance, said circuit means comprising:
      a microprocessor having a program logic therein for analyzing time data delivered thereto, said time data corresponding to a period of time of delivery of current produced by the household power to the appliance;
      means for providing a first data stream to said microprocessor indicative of an elapsed time period of current delivery to the appliance, said program logic comparing said time period to a preselected time period of operation;
      relay means having a normally closed position for controlling the current flow from the household socket to the appliance, said processor opening said relay means upon said calculated time period of current delivery exceeding said preselected time period of operation.

9. The device as claimed in claim 8 further comprising means on said modular housing for varying said preselected time period of operation, said means comprising a dial on said housing movable to certain preselected time values, said dial values sending data values usable by said program logic corresponding to said preselected time period of operation.

10. The device as claimed in claim 8 wherein said first data stream providing means is a 60 Hz analog time chip providing pulses to said program logic corresponding to elapsed seconds of time.

11. The device as claimed in claim 8 wherein said program logic includes a register for receiving the data stream therein and further comprising:

means for setting said register to a zero value prior to a start up of the appliance.

12. The device as claimed in claim 11 wherein said setting means comprises a switch on said housing, said switch delivering a signal to said program logic for said setting of register to zero.

13. A device for protecting an appliance receiving power from a household power socket comprising:

a modular housing positioned intermediate the household socket and appliance for electrically coupling the appliance to the household power;

a plug on said housing for connection to the household socket;

a socket on said housing to electrically couple the appliance to the household power;

circuit means within said housing and coupled with said housing plug and housing socket for monitoring current delivered to the appliance, said circuit means comprising:

a microprocessor having a program logic therein for analyzing the value of current delivered to the appliance;

means for providing data to said microprocessor indicative of an elapsed time in seconds corresponding to the elapsed time of current delivery to the appliance;

means for providing to the microprocessor data of a value of a current flow to the appliance, said program logic utilizing said time and current value for calculating a rate of consumption of electrical energy by the appliance, said logic comparing said rate of consumption to a preselected rate of consumption;

relay means having a normally closed position for controlling the current flow from the household socket to the appliance, said processor opening said relay means upon said calculated rate exceeding said preselected rate.

14. The device as claimed in claim 13 further comprising analog means on said modular housing for varying said preselected rate of consumption, said analog means sending data usable by said program logic corresponding to said preselected rate of consumption.

15. The device as claimed in claim 13 further comprising means for diverting a portion of the current flow to a current detect device, said current device converting the current to a form usable by said program logic.

16. The device as claimed in claim 13 wherein said first stream data providing means is a 60 Hz analog time chip, said chip providing data corresponding to seconds of time to said program logic.

17. The device as claimed in claim 13 wherein said program logic includes registers for receiving the provided data therein and further comprising:

means for setting said registers to a zero value prior to a start up of the appliance.

18. The device as claimed in claim 17 wherein said setting means comprises a switch on said housing, said switch delivering a signal to said program logic for said setting of registers to zero.

* * * * *

UNITED STATES PATENT AND TRADEMARK OFFICE
CERTIFICATE OF CORRECTION

PATENT NO. : 5,710,691
DATED : Jan. 20, 1998
INVENTOR(S) : David C. Fowler, et al.

It is certified that error appears in the above-identified patent and that said Letters Patent is hereby corrected as shown below:

The title page should be deleted to appear as per attached.

The drawing sheets consisting of Figs., 1-4 should be deleted to appear as per attached.

Signed and Sealed this

Twenty-fourth Day of March, 1998

*Attest:*

BRUCE LEHMAN

*Attesting Officer*  Commissioner of Patents and Trademarks

United States Patent [19]
Fowler et al.

[11] Patent Number: 5,710,691
[45] Date of Patent: Jan. 20, 1998

[54] PROGRAMMABLE CONTROL UNIT

[76] Inventors: David C. Fowler, 210 Oak St., Surgoinsville, Tenn. 37873; Dale D. Cummings, 5618 Hwy. 52, Dawsonville, Ga. 30534

[21] Appl. No.: 638,118

[22] Filed: Apr. 26, 1996

[51] Int. Cl.$^6$ .................... H02H 3/00; G01R 19/00
[52] U.S. Cl. ............... 361/94; 361/78; 361/87; 361/83; 364/480; 364/483
[58] Field of Search ................ 361/79, 83, 87, 361/93, 94, 98, 99, 96, 101, 102, 42, 49, 78; 364/480, 483; 307/141

[56] References Cited

U.S. PATENT DOCUMENTS

| | | | |
|---|---|---|---|
| 4,130,748 | 12/1978 | Schwer | 200/38 D |
| 4,223,307 | 9/1980 | Albritton | 340/656 |
| 4,249,035 | 2/1981 | Watley | 174/52 |
| 4,260,213 | 4/1981 | Kotski et al. | 439/185 |
| 4,422,018 | 12/1983 | Bailey | 315/360 |
| 4,471,232 | 9/1984 | Peddie et al. | 307/35 |
| 4,712,019 | 12/1987 | Nilssen | 307/141 |
| 4,829,457 | 5/1989 | Russo et al. | 364/550 |
| 4,903,162 | 2/1990 | Kopelman | 361/103 |
| 5,029,269 | 7/1991 | Elliott et al. | 363/21 |
| 5,122,726 | 6/1992 | Elliott et al. | 323/272 |
| 5,161,240 | 11/1992 | Johnson | 361/42 |
| 5,220,478 | 6/1993 | Innes et al. | 361/93 |
| 5,224,010 | 6/1993 | Tran et al. | 361/90 |

*Primary Examiner*—Jeffrey A. Gaffin
*Assistant Examiner*—Michael J. Sherry
*Attorney, Agent, or Firm*—Chase & Yakimo

[57] ABSTRACT

A programmable control unit for protecting an appliance connected to a household power source comprises a modular unit plugged into a household power socket. The modular unit presents a socket for plugging a household appliance therein. An internal microprocessor has program logic for analyzing the period of current flow to the household appliance and/or the power consumed thereby. Once the time period of operation and/or rate of energy consumption exceeds preselected values, the program logic of the microprocessor opens a relay so as to cease current flow to the appliance. The maximum threshold values of time and/or energy can be varied by the user according to the utilized appliance. The use of the intermediate unit enables a plurality of appliances to be safely coupled to the household power.

18 Claims, 3 Drawing Sheets